(12) United States Patent
Lim et al.

(10) Patent No.: US 6,448,579 B1
(45) Date of Patent: Sep. 10, 2002

(54) THIN FILM TRANSISTOR ARRAY SUBSTRATE FOR LIQUID CRYSTAL DISPLAY AND A METHOD FOR FABRICATING THE SAME

(75) Inventors: Byoung-Ho Lim; Yong-Wan Kim, both of Kumi-shi (KR)

(73) Assignee: L.G.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/729,725

(22) Filed: Dec. 6, 2000

(51) Int. Cl.[7] .................. H01L 29/04; H01L 31/036; H01L 31/0376; H01L 31/20
(52) U.S. Cl. ........................... 257/59; 257/72
(58) Field of Search .................. 257/59, 60, 61, 257/62, 64, 65, 66, 68, 70–72, 75, 347

(56) References Cited

U.S. PATENT DOCUMENTS 5,182,661 A * 1/1993 Ikeda et al. .................. 349/38
5,811,318 A    9/1998 Kweon

* cited by examiner

Primary Examiner—Tom Thomas
Assistant Examiner—Thien F Tran
(74) Attorney, Agent, or Firm—McKenna Long & Aldridge

(57) ABSTRACT

The present invention discloses a TFT array substrate (and method for making the same) having the large storage capacitance for use in a liquid crystal display device. In a four-mask process, the conventional storage capacitor of the TFT array substrate includes the capacitor electrodes and the insulation layer and semiconductor layer as a dielectric layer. However, the present invention includes the capacitor electrodes and the insulation layer as a dielectric layer so that the thickness of the dielectric layer becomes thinner. Therefore, much more electric charges can be stored in the storage capacitor. That means the liquid crystal display device can have a high picture quality and a high definition. Moreover, the present invention has a structure that can achieve the high manufacturing yield.

9 Claims, 10 Drawing Sheets

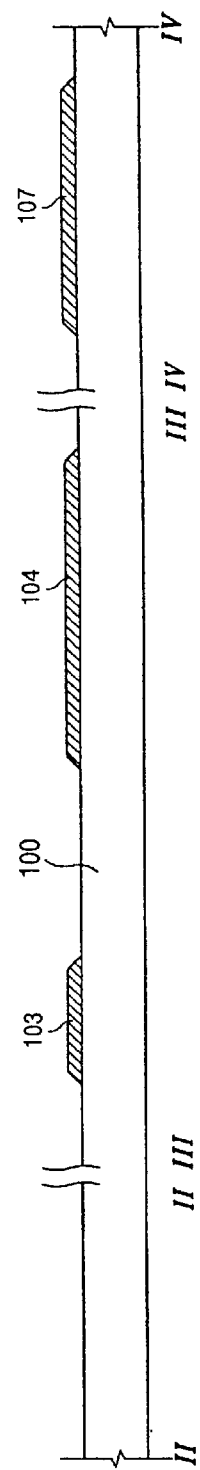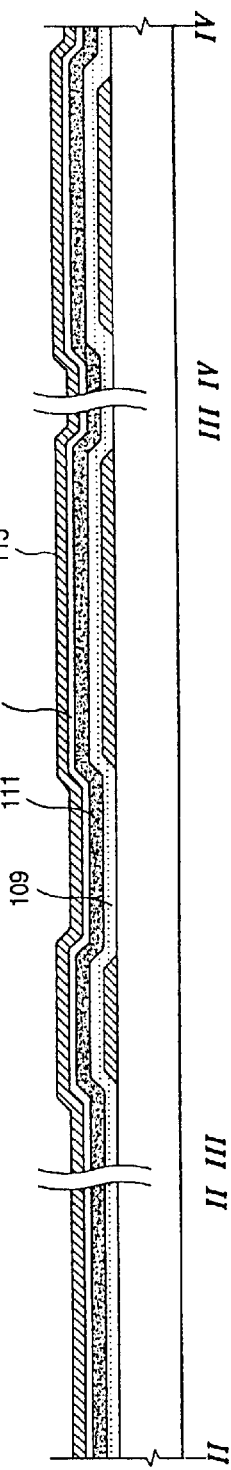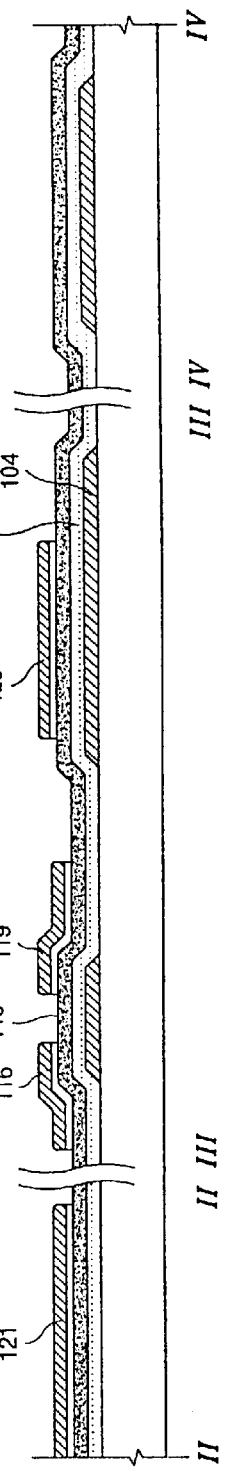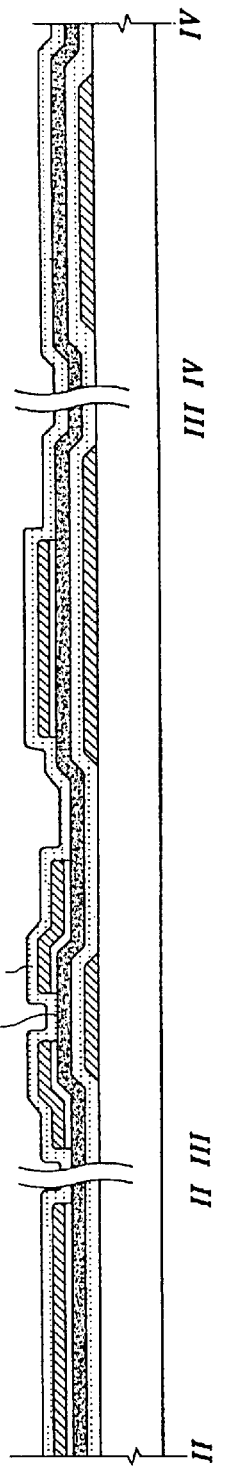
Fig.5a
Fig.5b
Fig.5c
Fig.5d

THIN FILM TRANSISTOR ARRAY SUBSTRATE FOR LIQUID CRYSTAL DISPLAY AND A METHOD FOR FABRICATING THE SAME

This application claims the benefit of Korean Patent Application No. 1999-21033, filed on Jun. 7, 1999, under 35 U.S.C. § 119, the entirety of which is hereby incorporated by reference.

BACKGROUND OF THE INVENTION

1. Field of the Invention

The present invention relates to a Liquid Crystal Display (LCD), and more particularly, to a Thin Film Transistor (TFT) array substrate and to a method of fabricating the same.

2. Description of Related Art

Generally, a liquid crystal display (LCD) comprises opposed upper and lower substrates and an interposed liquid crystal. On the lower substrate, a plurality of gate lines extending in one direction and a plurality of data lines extending in a perpendicular direction are formed. Within this matrix arrangement is a plurality of thin film transistors (TFTs) disposed near the crossings of the data and gate lines. The TFTs are used as switches that selectively apply voltages across the liquid crystal.

Nowadays, the liquid crystal display (LCD) is frequently used in computers, such as laptop computers. While liquid crystal displays started out as relatively simple display devices, they have become large and relatively complex displays. A large-sized LCD employs an active matrix array substrate that includes numerous pixel regions, data and gate lines that cross each other to define the pixel regions, and TFTs (switching device) positioned near the crossings of the data and gate lines.

With such active matrix type liquid crystal displays, high picture quality and high definition are important. To help achieve such features, storage capacitors in parallel with pixel electrodes have been used.

In general, without a storage capacitor, the electric charge of a first signal applied through the TFT will leak away after a short time. In contrast, with a storage capacitor the first electric charge is maintained until the application of a second signal.

In general, for the storage capacitor the gate line acts as one capacitor electrode and the pixel electrode acts as the other capacitor electrode.

FIG. 1 is an enlarged plan view illustrating the array substrate of a conventional active matrix type LCD having a pixel region "P", a storage capacitor "C", a TFT "A" and gate and data lines 36 and 49. A drain electrode 47 of the TFT "A" is connected to a pixel electrode 40 of the pixel region "P" via a contact hole 57.

A semiconductor channel region 53 is formed between source and drain electrodes 45 and 47 by exposing a portion of the intrinsic semiconductor layer 39. Ohmic contact regions are formed between the intrinsic semiconductor layer 39 and the source and drain electrodes 45 and 47. Gate and data pads (not shown) are formed at one end of the gate and data lines 36 and 49.

FIGS. 2a to 2f are cross-sectional views taken along line I–I of FIG. 1, and are used to illustrate process steps of fabricating a TFT array substrate using a conventional four-mask process.

Referring to FIG. 2a, a first metallic layer is formed on a substrate 31 and is then patterned using a first mask process to form a gate pad (not shown), a gate electrode 33 and a gate line 36. The first metallic layer is beneficially made of a metallic material having a low resistance, such as Aluminum (Al) or Al-alloy. When the gate line 36 is used as a capacitor electrode, the time constant of the gate line increases. Thus, a material having the low resistance, such as Aluminum, is preferably used for the gate line. Aluminum can decrease the time constant compared with a material having a higher resistance, such as Tantalum (Ta) or Chrome (Cr).

The gate electrode 33 is extended from the gate line 36 and is formed at the corner of the pixel region. Referring back to FIG. 1, a portion of the gate line 36 is used as a capacitor electrode of the storage capacitor "C".

As shown in FIG. 2b, a first insulation layer 37 is formed by depositing an inorganic substance, such as Silicon Nitride ($SiN_x$) or Silicon Oxide ($SiO_2$), or an organic substance, such as BCB (Benzocyclobutene) or acryl, on the substrate 31 while covering the gate electrode 33 and the gate line 36 (and thus the capacitor electrode). Then, an intrinsic semiconductor layer 39, such as pure amorphous silicon, is formed on the first insulation layer 37. Then, an extrinsic semiconductor layer 41, such as impurity (n+ or p+) doped amorphous silicon, is sequentially formed on the intrinsic semiconductor layer 39. Then, a second metallic layer 43 made of a material such as Molybdenum (Mo), Tantalum (Ta), Tungsten (W), Antimony (Sb) or the like is formed on the extrinsic semiconductor layer 41.

Referring to FIG. 2c, the source and drain electrodes 45 and 47, data line 49 (see FIG. 1), data pad (not shown) and second capacitor electrode 51 having an island shape are formed by patterning the second metallic layer 43 and the extrinsic semiconductor layer 41 using a second mask process. The source and drain electrodes 45 and 47 are spaced apart from each other to expose the semiconductor channel region 53. At this time, the extrinsic semiconductor layer 41 is removed using the source and drain electrodes 45 and 47 as a mask. Moreover, careful is required in this step, so as not to pattern the intrinsic semiconductor layer 39.

The portions of the extrinsic semiconductor layer 41 between the intrinsic semiconductor layer 39 and the source and drain electrodes 45 and 47 act as ohmic contact layers 43a and 43b, respectively.

As shown in FIG. 2d, a second insulation layer or protection layer 53 is formed on the metallic layers 45, 47 and 51, and on the intrinsic semiconductor layer 39.

Referring to FIG. 2e, contact holes 55 and 57 are formed by patterning the protection layer 53. Simultaneously, the pixel region "P" is formed by patterning the protection layer 53, the intrinsic semiconductor layer 39, and the first insulation layer 37 using a third mask process, except for the region for the storage capacitor and the data line.

Referring to FIG. 2f, a transparent conductive substance such as ITO (indium-tin-oxide) is deposited and patterned using a fourth mask process to form a pixel electrode 40. Thus, the pixel electrode 40, which electrically connects to the second capacitor electrode 51 and to the drain electrode 47 via contact holes 55 and 57, is formed.

FIG. 3a is an enlarged view illustrating the portion "C" of FIG. 2f, while FIG. 3b is an equivalent circuit of FIG. 3a.

As shown in FIGS. 3a and 3b, the storage capacitor "C" includes the first capacitor electrode/gate line 36. It also includes the second capacitor electrode 51 (having a contact with the pixel electrode 40), the first insulation layer 37 (which stores the electric charge as a dielectric layer), and the semiconductor layer 42 (the intrinsic and extrinsic semiconductor layers 39 and 41 that act as a dielectric layer).

According to the conventional method for manufacturing a TFT array substrate using a four-mask process, the process steps are reduced over a five-mask process. However, the storage capacitance is also decreased compared to the five-mask process. For a better understanding, the storage capacitance is represented by the following equation:

$$C_{st} = \frac{\varepsilon \cdot A}{d} \quad (1)$$

In the above equation (1), "$C_{st}$" denotes capacity, "$\varepsilon$" denotes a dielectric constant of the dielectric layer, "d" represents the thickness of the dielectric layer and "A" represents the area of the capacitor electrode. As described by Equation (1), the storage capacitance "$C_{st}$" is in proportion to the area "A" and is in inverse proportion to the thickness "d" of the dielectric layer.

Therefore, due to the fact that the dielectric layer includes two layers (the first insulation layer 37 and the semiconductor layer 42) between the two capacitor electrodes 36 and 51, in the conventional four-mask process the capacitance is less than it could be.

SUMMARY OF THE INVENTION

In order to overcome the problems described above, a preferred embodiment of the present invention provides a method of fabricating a TFT array substrate having a large storage capacitance using a four-mask process, beneficially for use in an LCD device that has high picture quality and high definition.

In order to achieve the above objects, in one aspect, the preferred embodiment of the present invention provides for a thin film transistor (TFT) array substrate, including: a substrate; a plurality of a gate lines on the substrate; a plurality of data lines crossing the gate lines and formed over the substrate; a pixel electrode in a pixel region that is defined by the crossing data and gate lines; a TFT connecting to the pixel electrode; and a storage capacitor connecting to the pixel electrode, said storage capacitor including: the gate line; a first insulation layer on the gate line; intrinsic and extrinsic semiconductor layers formed sequentially on the first insulation layer; a first capacitor electrode on the semiconductor layer; a second insulation layer over the first capacitor electrode and semiconductor layer; and a second capacitor electrode on the second insulation layer in a position corresponding to the first capacitor electrode.

The TFT array substrate has a gate contact hole exposing a portion of the gate line and positioned at one side of the first capacitor electrode. The TFT array substrate has at least one gate contact hole, and the contact hole penetrates the central part of the first capacitor electrode. The TFT array substrate further includes the gate line and first capacitor electrode having electrical connections to each other using a transparent conductive electrode.

In order to achieve the above object, in another aspect, the present invention provides a method of fabricating a thin film transistor (TFT) array substrate, including: providing a substrate; depositing a first metallic layer on the substrate; forming a gate electrode and gate line on the substrate by patterning the first metallic layer using a first mask process; forming a first insulation layer over the gate electrode, gate line and substrate; forming an intrinsic semiconductor layer on the first insulation layer; forming an extrinsic semiconductor layer on the intrinsic semiconductor layer; depositing a second metallic layer on the extrinsic semiconductor layer; forming a data line, source and drain electrodes, and a first capacitor electrode having an island shape over the gate line by patterning the second metallic layer and extrinsic semiconductor layer using a second mask process; forming a second insulation layer over the data line, source and drain electrodes, and first capacitor electrode; forming a drain contact hole by patterning the second insulation layer using a third mask process, simultaneously, forming a pixel region and gate contact hole by patterning the first and second insulation layers and intrinsic semiconductor layer, simultaneously, exposing the portion of the first capacitor electrode by patterning the second insulation layer; depositing a transparent conductive electrode over the entire surface; and patterning the transparent conductive electrode by using a fourth mask process to form an electrode connecting layer connecting the first capacitor electrode with the gate line, to form a pixel electrode connected to the drain electrode via the drain contact hole, and to form a second capacitor electrode extended from the pixel electrode, overlapping the first capacitor electrode, and spaced apart from the electrode connecting layer.

In the method of fabricating the TFT array substrate, the gate electrode is beneficially made of Aluminum (Al) or of an Al-alloy. The method of fabricating the TFT array substrate further comprises the step of forming the gate contact hole exposing the portion of gate line and positioned at the one side of the first capacitor electrode by patterning the intrinsic semiconductor layer and first insulation layer. The method fabricates at least one gate contact hole. The contact hole penetrates the central part of the first capacitor electrode and is formed over the gate electrode. The method further comprises the steps of fabricating a storage capacitor, wherein the second capacitor electrode formed on the second insulation layer is over the first capacitor electrode.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which:

FIG. 3b is an equivalent circuit view of FIG. 3a.

FIGS. 5a to 5g are cross-sectional views taken along line II—II, line III—III and line IV—IV of FIG. 1, illustrating process steps of fabricating a TFT array substrate according to a first embodiment;

FIG. 6b is an equivalent circuit view of FIG. 6a.

DETAILED DESCRIPTION OF PREFERRED EMBODIMENTS

In one preferred embodiment of the present invention there is provided a thin film transistor (TFT) array substrate having a large storage capacitance and which is made using a four-mask process.

Figure 1:
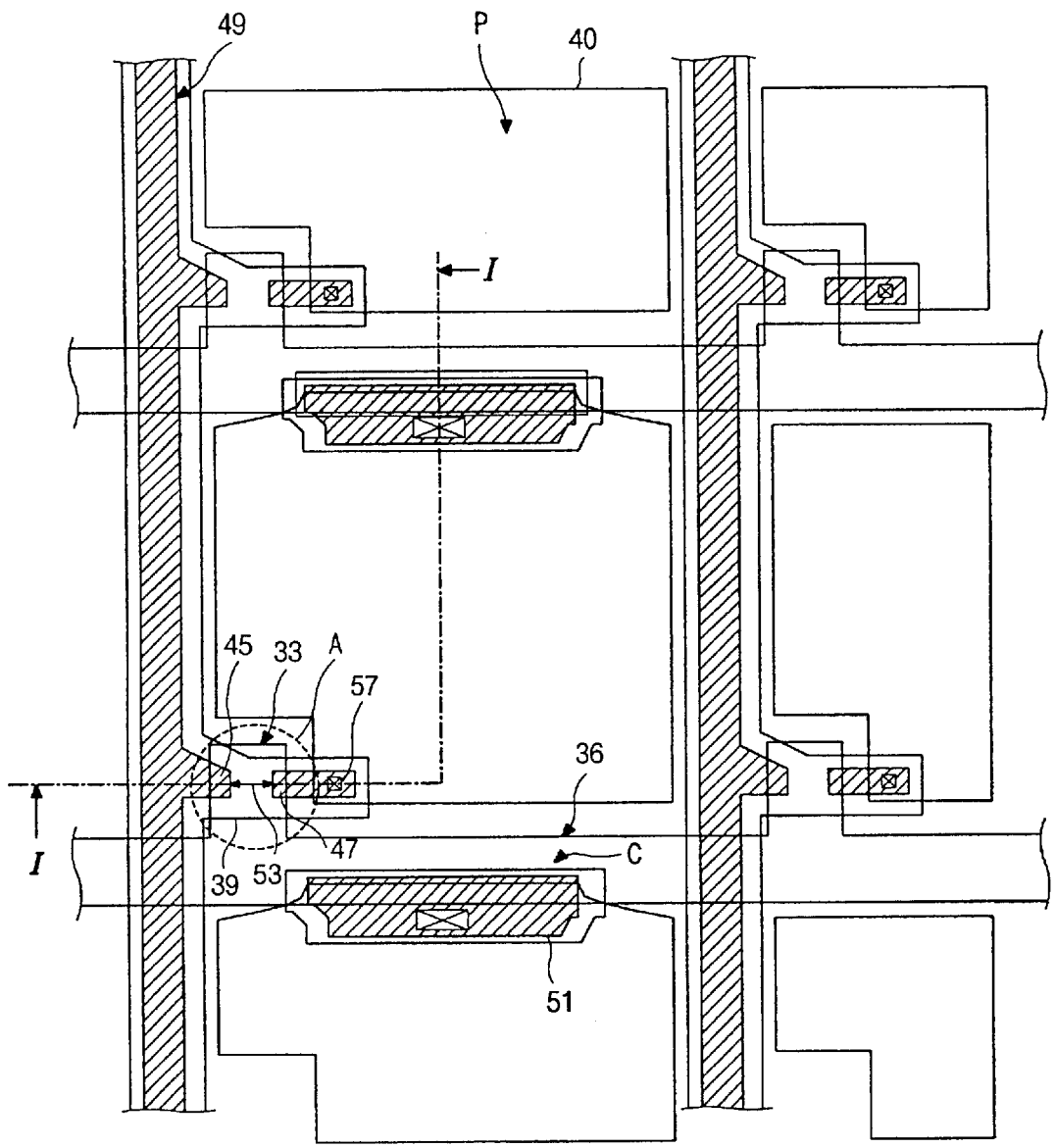
FIG. 1 is a partial plane view illustrating a TFT array substrate of a conventional active matrix type LCD.
Figure 2A:
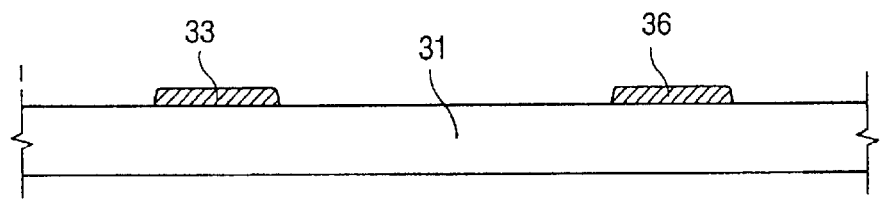
FIGS. 2a to 2f are cross-sectional views taken along line I—I of FIG. 1, illustrating process steps of fabricating a TFT using a conventional four-mask process.
Figure 2B:
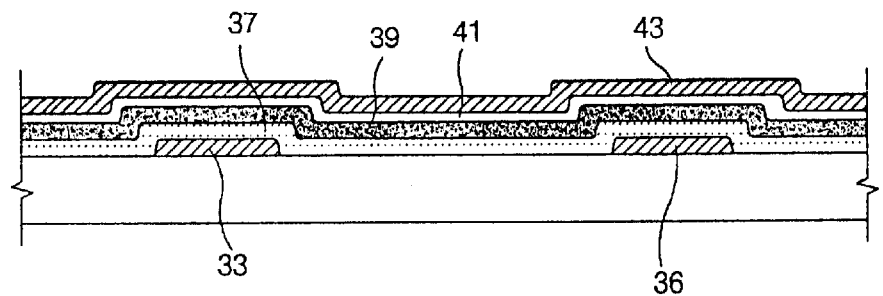
Figure 2C:
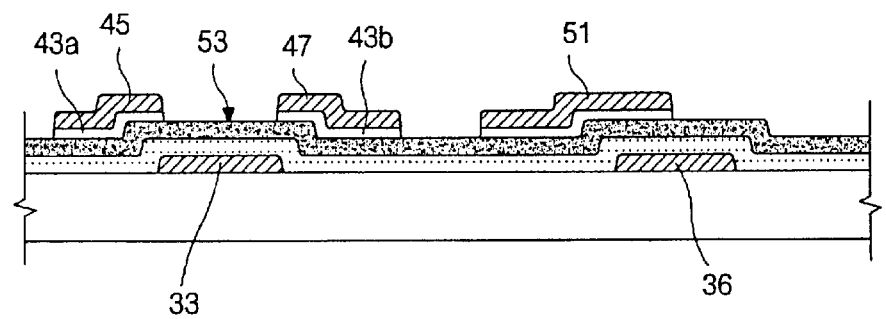
Figure 2D:
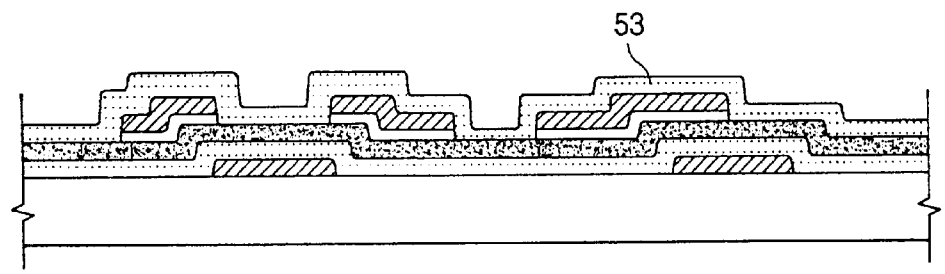
Figure 2E:
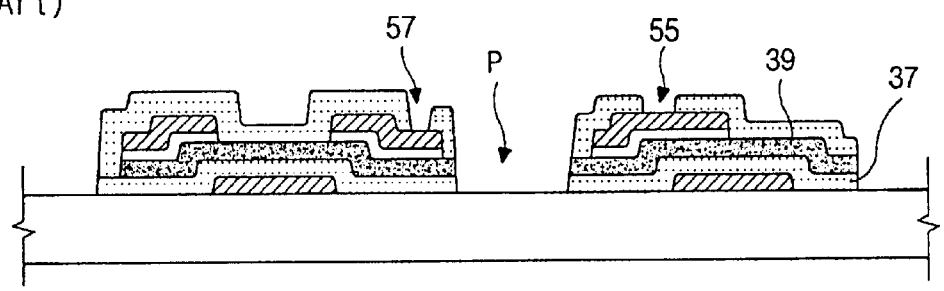
Figure 2F:
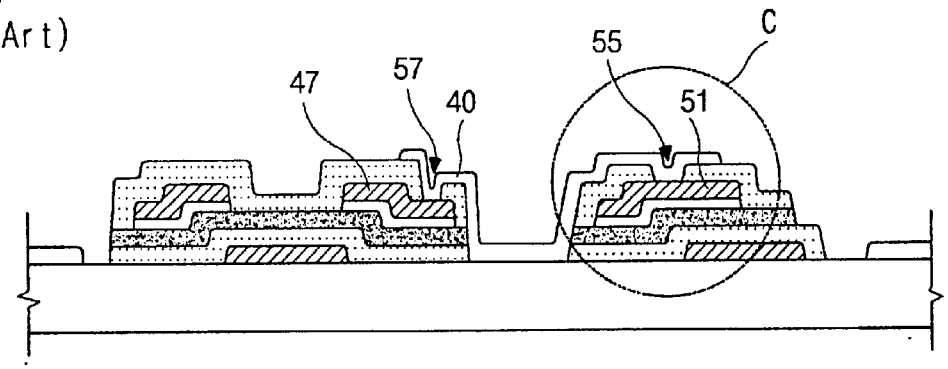
Figure 3A:
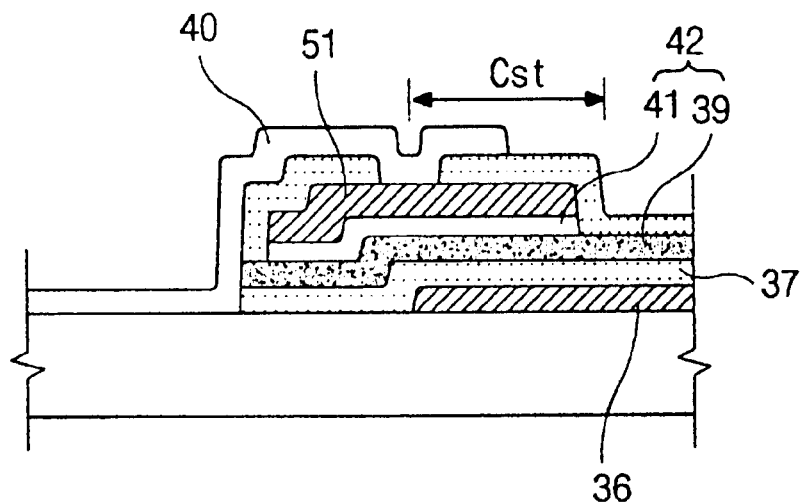
FIG. 3a is an enlarged view illustrating the portion "C" of FIG. 2f.
Figure 3B:
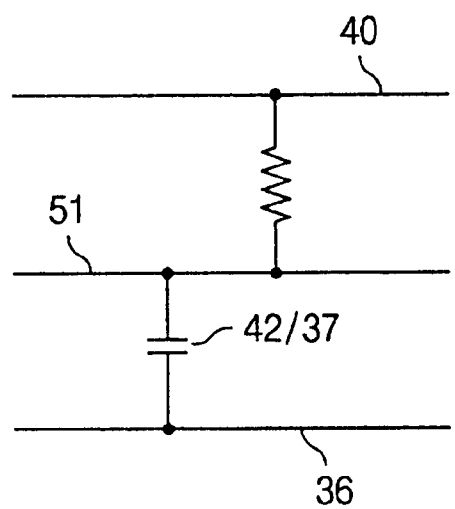
Figure 4:
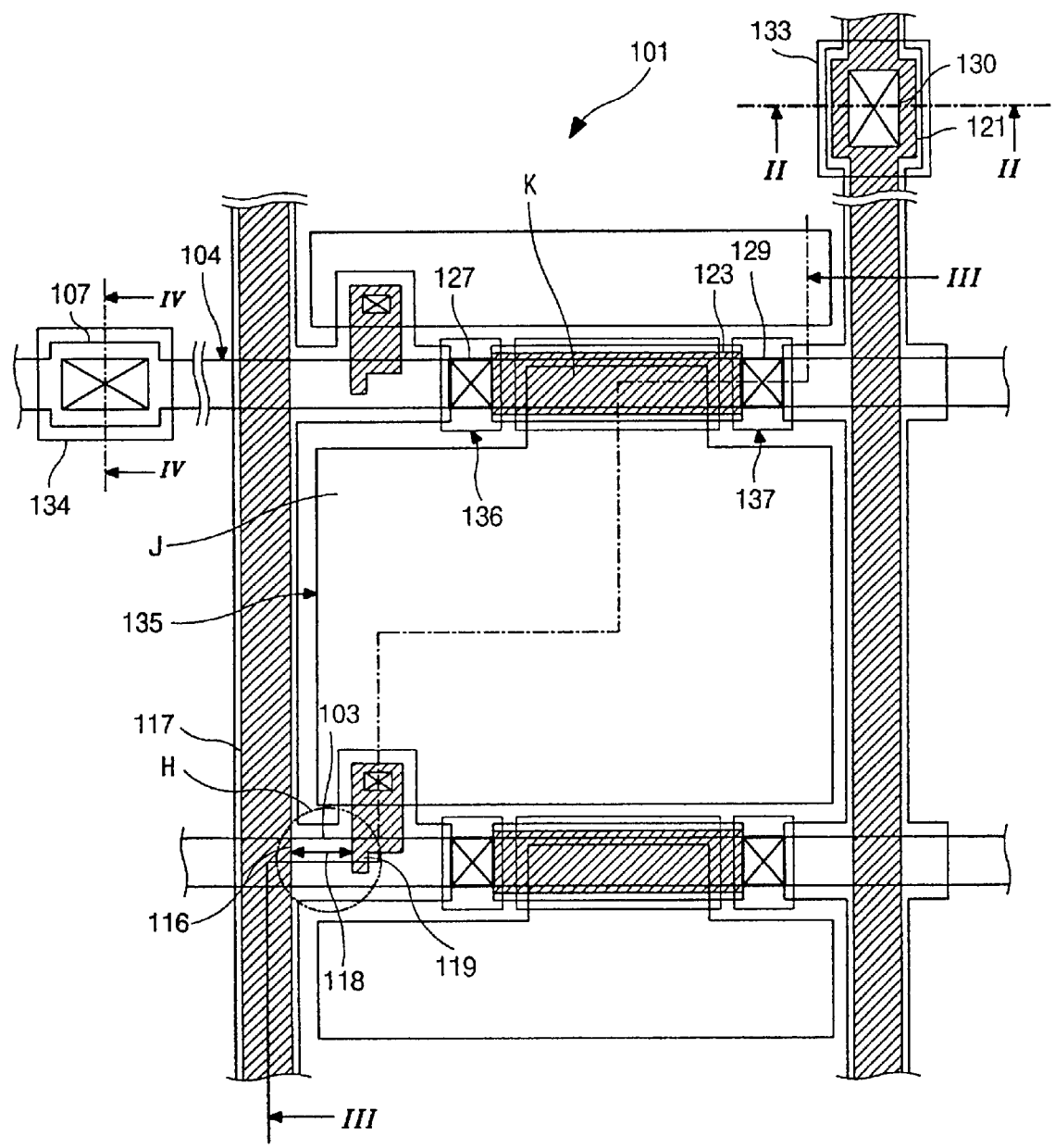
FIG. 4 is a partial plane view illustrating the TFT array substrate of a first preferred embodiment of the present invention.

FIG. 4 is a plane view illustrating a portion of a TFT array substrate 101 according to a first preferred embodiment of the invention. The TFT array substrate 101 includes a TFT "H", storage capacitor "K", gate line 104, data line 117, gate pad 107, and data pad 121.

FIGS. 5a to 5g are cross-sectional views taken along line II—II (the data pad), line III—III (the TFT, pixel region and storage capacitor), and line IV—IV (the gate pad) of FIG. 4. Those figures help illustrate the process steps of fabricating a TFT array substrate according to the first embodiment.

A first metallic layer (not shown), beneficially of Aluminum (Al) or an Al-alloy, is deposited on a substrate 100. As shown in FIG. 5a, a gate line 104, a gate pad 107, and a gate shorting line (not shown) are formed by patterning the first metallic layer using a first mask. In practice, plural gate pads 107 are formed and interconnected using a gate shorting line (not shown). A part of the gate line 104 is used for a gate electrode 103, and another part of the gate line 104, which will be under a pixel electrode 135 (see FIG. 4), acts not only as the gate line, but also as a first capacitor electrode of the storage capacitor "K" (see FIG. 4).

Referring to FIG. 5b, a first insulation layer 109 is formed by depositing an inorganic substance, such as Silicon Nitride (SiN$_x$) or Silicon Oxide (SiO$_2$), or an organic substance, such as BCB (Benzocyclobutene) or acryl, on the entire substrate 100, while covering the gate electrode 103, the first capacitor electrode 104 and the gate pad 107. Then, an intrinsic semiconductor layer 111, such as pure amorphous silicon, is formed on the first insulation layer 109. Then, an extrinsic semiconductor layer 113, such as impurity (n$^+$ or p$^+$) doped amorphous silicon, is formed on the intrinsic semiconductor layer 111. Then, a second metallic layer 115, made of a material such as Molybdenum (Mo), Tantalum (Ta), Tungsten (W), or Antimony (Sb) is formed on the extrinsic semiconductor layer 113.

Referring to FIG. 5c, the source and drain electrodes 116 and 119, data line 117 (see FIG. 4), data pad 121 (see FIG. 4), data shorting line (not shown) and first capacitor electrode 123 having an island shape are formed by patterning the second metallic layer 115 and the extrinsic semiconductor layers 113 using a second mask process. The source and drain electrodes 116 and 119 are spaced from each other and expose the semiconductor channel region 118. At this time, the extrinsic semiconductor layer 113 between the source and drain electrodes 116 and 119 is removed using the source and drain electrodes 116 and 119 as masks.

The source electrode 116 is extended from the data line 117 (see FIG. 4). The data pad 121 is connected to the data line 117 (see FIG. 4) and transmits an external signal to the data line 117 (see FIG. 4). The portions of the extrinsic semiconductor layer 113 between the intrinsic semiconductor layer 111 and the source and the drain electrodes 116 and 119 act as ohmic contact layers.

As shown in FIG. 5d, an insulating protection layer 125 is formed on the metallic layers 116, 119, and 123, and on the intrinsic semiconductor layer 111. The protection layer 125 provides protection for the semiconductor channel region 118 when etching the array substrate, and is made of an inorganic substance, such as Silicon Nitride (SiN$_x$) or Silicon Oxide (SiO$_2$), or an organic substance, such as BCB (Benzocyclobutene) and acryl.

Figure 5E:
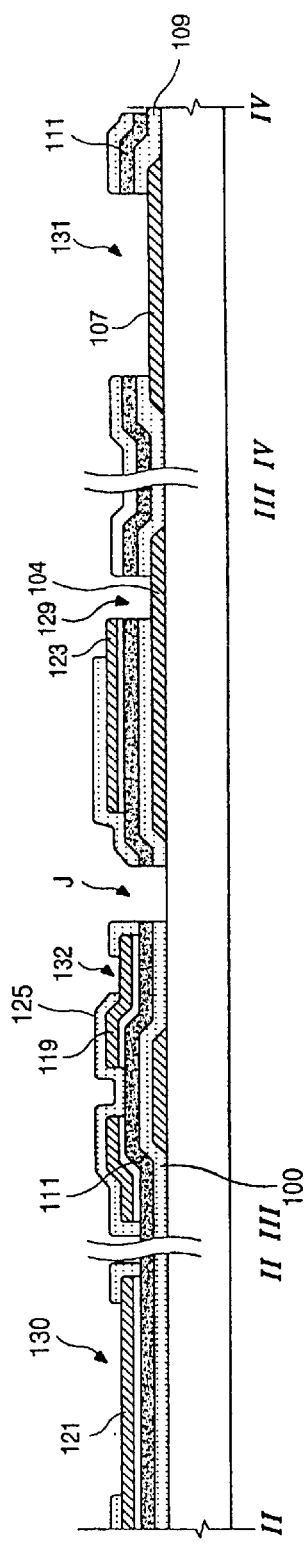

Referring to FIG. 5e, the pixel region "J" is formed by patterning the protection layer 125, the intrinsic semiconductor layer 111, and the first insulation layer 109 using a third mask process. Simultaneously, the first and second gate contact holes 127 (see FIG. 4) and 129 are formed through both sides of the first capacitor electrode 123 by patterning the protection layer 125, the intrinsic semiconductor layer 111, and the first insulation layer 109, except in the region of the storage capacitor and the data line. Also simultaneously, a drain contact hole 132 and a data pad contact hole 130 are formed by patterning the protection layer 125. Also simultaneously, patterning the first insulation layer 109, the protection layer 125, and the intrinsic semiconductor layer 111 over the gate pad 107 forms a gate pad contact hole 131. Moreover, while forming the first and second gate contact holes 127 (see FIG. 4) and 129 at both sides of the first capacitor electrode 123, the peripheral portion of the first capacitor electrode 123 is exposed by patterning the protection layer 125.

Figure 5F:
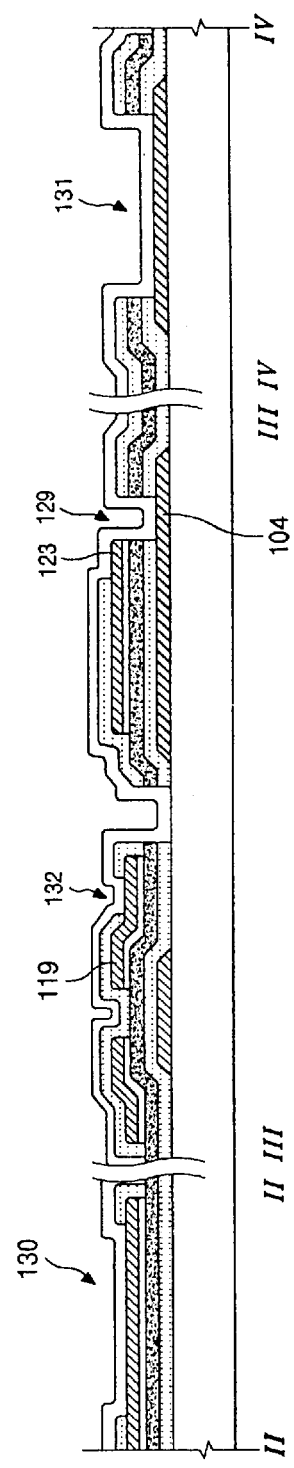
Figure 5G:
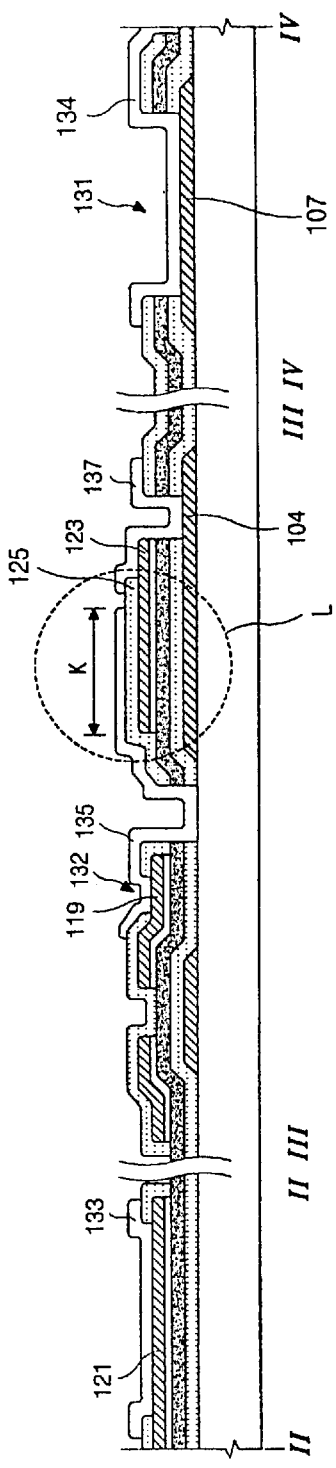

Referring to FIG. 5f, a transparent conductive substance, such as ITO (indium-tin-oxide), is deposited over the entire surface, and is then patterned using a fourth mask process. Thus, as shown in FIG. 5g, a data pad terminal 133 connects to the data pad 121 via the data pad contact hole 130, and a gate pad terminal 134 connects to the gate pad 107 via the gate pad contact hole 131. Moreover, the pixel electrode 135 connects to the drain electrode 119 via the drain contact hole 132, extends over the first capacitor electrode 123, and is spaced apart from an electrode connecting layer 137. While patterning the transparent conductive substance, the electrode connecting layers 136 (see FIG. 4) and 137 are formed around the first and second gate contact holes 127 (see FIG. 4) and 129. The electrode connecting layers 136 (see FIG. 4) and 137 electrically connect the gate line 104 with the first capacitor electrode 123 via the first and second gate contact holes 127 (see FIG. 4) and 129. Therefore, the storage capacitor "K" is completed in the portion "L".

In this invention, the electrode connecting layers 136 and 137 prevent the gate line 104 from erosion by an etchant.

Figure 6A:
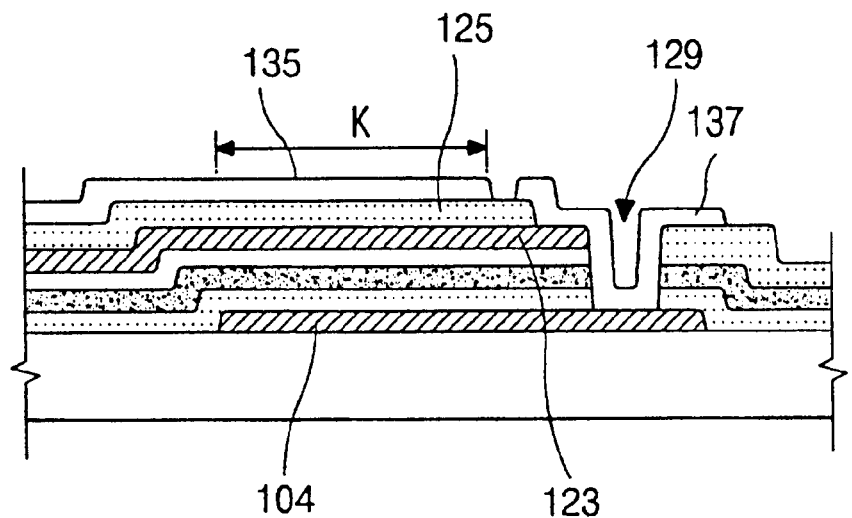
FIG. 6a is an enlarged view illustrating the portion "L" of FIG. 5g.
Figure 6B:
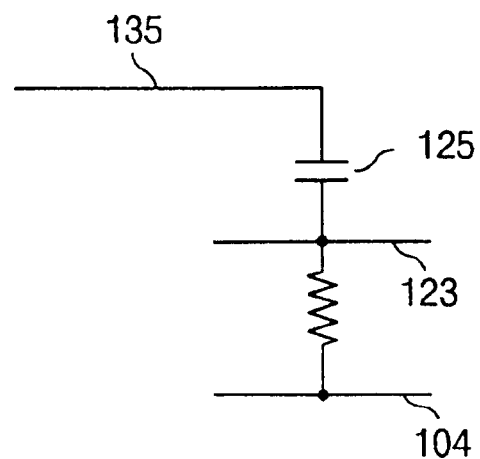

FIG. 6a is an enlarged view illustrating the portion "L" of FIG. 5g, and FIG. 6b is an equivalent circuit of FIG. 6a. As shown in FIGS. 6a and 6b, the storage capacitor "L" includes the first capacitor electrode 123, which is connected to the gate line 104 by the electrode connecting layer 137 via the contact hole 129. The storage capacitor also includes the pixel electrode 135, which acts as a second capacitor electrode, and the protection layer 125 which is a dielectric layer that stores the electric charge. Therefore, the TFT array substrate of the present invention is made by a four-mask process and that includes only one dielectric layer (125) in the storage capacitor. The conventional art has a storage capacitor that includes the semiconductor layer and an insulation layer as dielectric layers between the capacitor electrodes. Again, the storage capacitor of the present invention has only an insulation layer as a dielectric layer. That means that the storage capacitance can be enlarged according to the following equation:

$$C_{st} = \frac{\varepsilon \cdot A}{d} \quad (1)$$

The thickness "d" of the dielectric layer 125 becomes thinner while the area "A" of the capacitor electrodes becomes larger. Therefore, the storage capacitance "$C_{st}$", which is proportional to the area "A" and is in inverse proportion to the thickness "d" of the dielectric layer, is increased.

As described above, the storage capacitor is located in the central part of the gate line. However, in a second embodiment a storage capacitor is located at both sides of the gate line.

Figure 7:
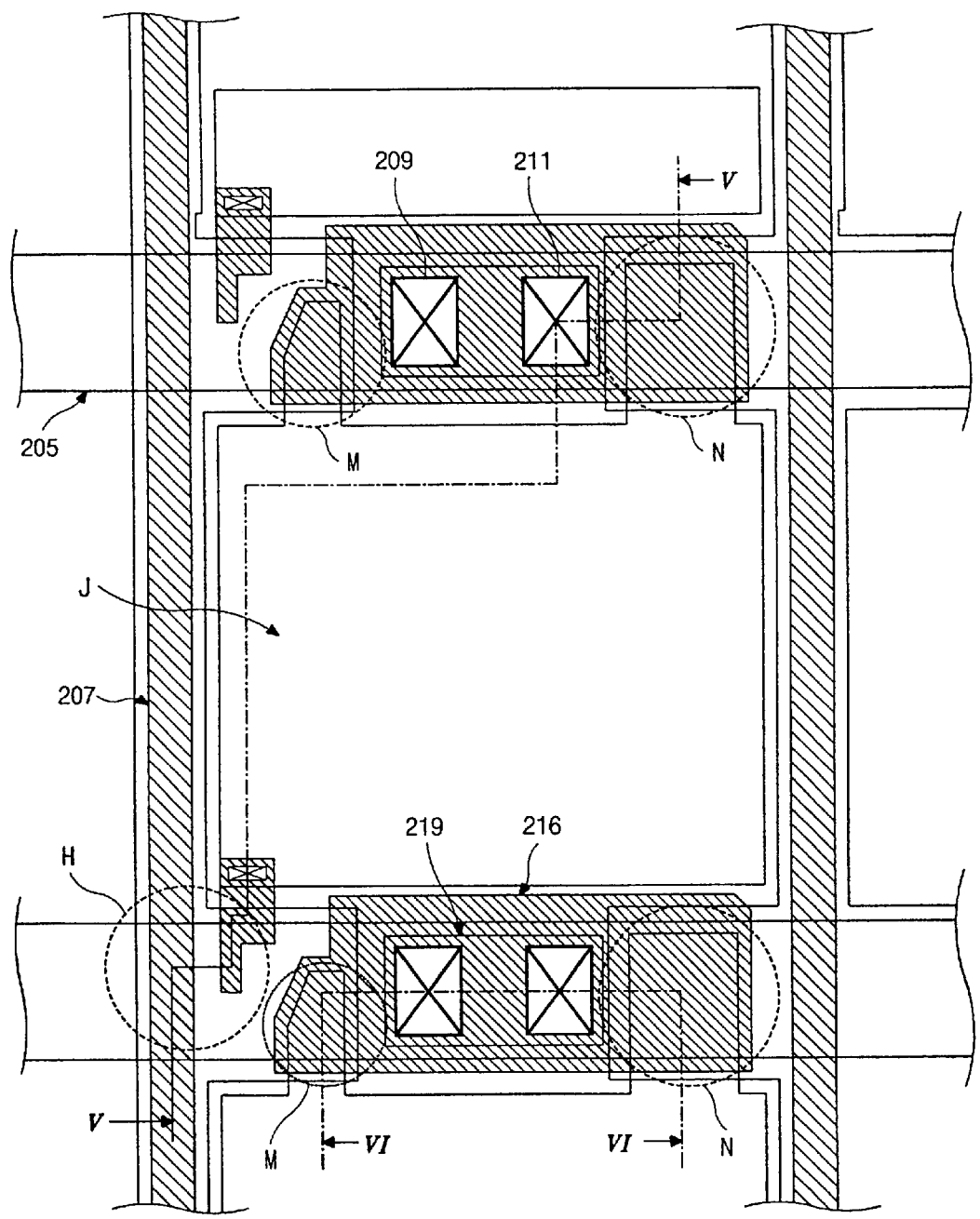
FIG. 7 is a partial plane view illustrating the TFT array substrate of a second embodiment of the present invention.

FIG. 7 is a partially enlarged plan view illustrating a TFT array substrate of a second embodiment of the present invention. That TFT array substrate includes a pixel region "J" having a pixel electrode defined by crossings of gate lines 205 and data lines 207, a TFT "H" disposed near the crossing of a data line 207 and a gate line 205, and first and second storage capacitors "M" and "N". First and second gate contact holes 209 and 211 are positioned on the gate line 205 between the first and second storage capacitors "M" and "N".

Figure 8:
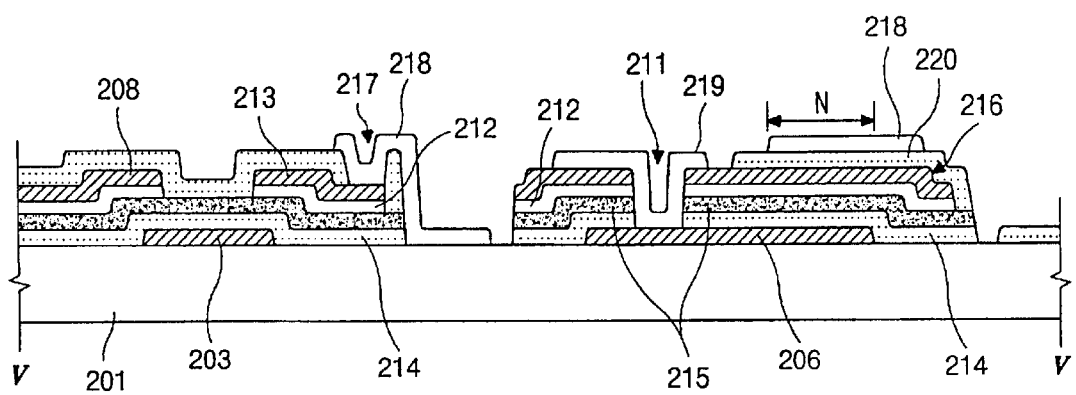
FIG. 8 is a cross-sectional view taken along line V—V of FIG. 7.

FIG. 8 is a cross-sectional view taken along line V—V of FIG. 7. In this embodiment the process steps are similar to the first embodiment, thus some of the processing steps are omitted.

A first insulation layer 214, semiconductor layers 215 and 212, and a second metallic layer are formed over a substrate 201, gate electrode 203, gate line 205 (see FIG. 7), and a gate pad (not shown). Patterning the second metallic layer and the extrinsic semiconductor layer 212 form a source electrode 208 that is extended from the data line 207, and a drain electrode 213. This is performed using a second mask process. Then, a first capacitor electrode 216 is formed in an island shape over a portion of the gate line 206.

A second insulation layer 220, which is beneficially the same substance as in the first embodiment, is formed over the entire substrate. A drain contact hole 217 is then formed by patterning the second insulation layer 220 using a third mask process. Simultaneously, first and second gate contact holes 209 (see FIG. 7) and 211 are formed by patterning the second insulation layer 220, first capacitor electrode 216, semiconductor layers 215 and 212, and the first insulation layer 214. Simultaneously, patterning the second insulation layer 220 exposes a portion of the first capacitor electrode 216. At this time, the second insulation layer 220 is removed, except at the peripheral portions over the gate line 206 (see FIG. 9).

A transparent conductive substance such as ITO (indium-tin-oxide) is deposited over the entire surface and is then patterned using a fourth mask process. Thus, a pixel electrode 218, which electrically connects to the drain electrode 213 via the drain contact hole 217, is formed using a four mask process. Simultaneously, an electrode connecting layer 219 that electrically connects the gate line 206 with the first capacitor electrode 216 via the first and second gate contact holes 209 (see FIG. 9) and 211 is formed. Thus, the pixel electrode 218 is spaced apart from the electrode connecting layer 219. Therefore, the gate line 206 and the first capacitor electrode 216, which are electrically connected by the electrode connecting layer 219, act as a first capacitor electrode of a storage capacitor. The pixel electrode 218 acts as a second capacitor electrode. Moreover, the second insulation layer 220 acts as a dielectric layer of the storage capacitor.

Figure 9:
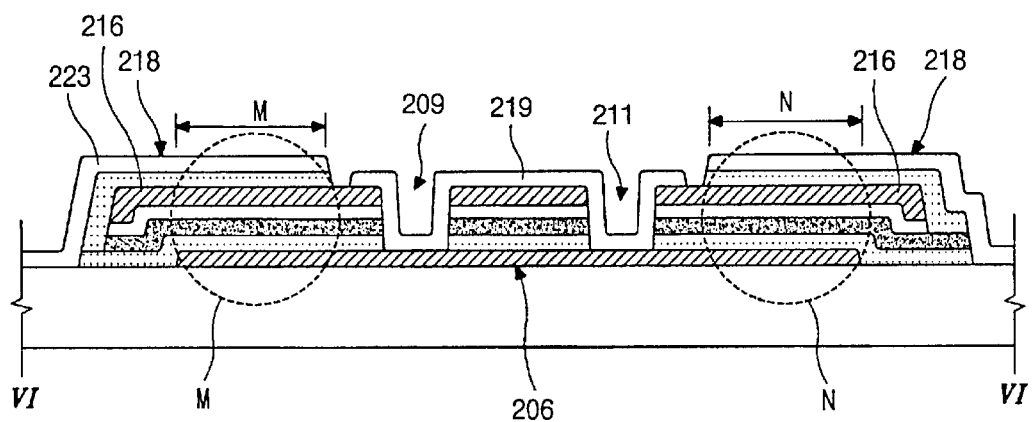
FIG. 9 is a cross-sectional view taken along line VI—VI of FIG. 7.

FIG. 9 is a cross-sectional view taken along line VI—VI of FIG. 7 and illustrates two storage capacitors "M" and "N" formed in one pixel region. As shown in FIG. 9, the first and second contact holes 209 and 211 are formed over the central part of the gate line 206, and then the storage capacitors "M" and "N" are completed at both sides of the first capacitor electrode. In this embodiment, the electrode connecting layer 219 prevents the gate line 206 from erosion by an etchant.

As mentioned above, in the first and second storage capacitors "M" and "N", the first capacitor electrode 216 is the gate line 206 and the metallic layer, which are connected by the electrode connecting layer 219, and the second capacitor electrode is the pixel electrode which is spaced apart from the electrode connecting layer 219 and overlaps the first capacitor electrode 216.

Therefore, the TFT array substrate of the second embodiment made by a four-mask process includes only one dielectric layer 220 in the storage capacitor (as compared to the prior art). Since the conventional art has a storage capacitor including a semiconductor layer and an insulation layer as a dielectric layer between the capacitor electrodes, the storage capacitance of the conventional art is smaller than that of present invention.

Hence, the storage capacitance of the second embodiment can be enlarged according the above-mentioned equation (1).

As described above, a TFT array substrate for use in a liquid crystal display device according to the preferred embodiment of the present invention has a structure that obtains a high manufacturing yield and an enlarged storage capacity. As such, the TFT array substrate of the invention assists manufacturing LCD devices with reduced flicker and with high picture quality and high definition.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A thin film transistor (TFT) array substrate for use in LCD device, comprising:

a substrate;

a gate line on the substrate;

a data line crossing over the gate line and formed over the substrate;

a pixel electrode in a pixel region adjacent the data line and the gate line;

a TFT connected to the pixel electrode; and a storage capacitor connected to the pixel electrode, said storage capacitor including:
   the gate line;
   a first insulation layer on the gate line;
   intrinsic and extrinsic semiconductor layers stacked sequentially on the first insulation layer;
   a first capacitor electrode formed on the semiconductor layers and electrically connected to the gate line;
   a second insulation layer over the first capacitor electrode and semiconductor layers; and
   a second capacitor electrode elongated from the pixel electrode on the second insulation layer in a position of corresponding to the first capacitor electrode.

2. The thin film transistor (TFT) array substrate of claim 1, wherein the first capacitor electrode is electrically connected to the gate line through a gate contact hole penetrating the first insulation layer and the intrinsic and extrinsic semiconductor layers.

3. The thin film transistor (TFT) array substrate of claim 2, further comprising, an electrode connecting layer for connecting the first capacitor electrode and the gate line through the gate contact hole.

4. An array substrate, including:

a substrate;

a plurality of gate lines on said substrate;

a first insulating layer over said gate lines and over said substrate;

a plurality of data lines on said first insulating layer, wherein said plurality of data lines cross said plurality of gate lines;

a silicon layer on portions of said first insulating layer;

a TFT formed from said silicon layer, wherein said TFT includes a drain electrode;

a capacitor electrode formed on said silicon layer;

an electrode connecting layer that electrically connects said capacitor electrode to a gate line of said plurality of gate lines;

a second insulating layer over said capacitor electrode; and a pixel electrode over said second insulating layer;

wherein said pixel electrode electrically connects to said drain electrode, and wherein said pixel electrode, said capacitor electrode, and said second insulating layer form a storage capacitor.

5. An array substrate according to claim 4, wherein said electrode connecting layer is over said gate line.

6. An array substrate according to claim 5, wherein said electrode connecting layer extends along a contact hole that passes through said silicon layer and through said first insulation layer.

7. An array substrate according to claim 6, wherein said capacitor electrode extends over a width of said gate line.

8. An array substrate according to claim 4, wherein said second insulating layer consists of a member from a group consisting of silicon nitride, silicon oxide, BCB, and acryl.

9. An array substrate according to claim 4, wherein said pixel electrode is transparent.

* * * * *